US011742833B1

(12) United States Patent
Tsironis (10) Patent No.: US 11,742,833 B1
(45) Date of Patent: Aug. 29, 2023

(54) TEMPERATURE CONTROLLED HIGH POWER TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 459 days.

(21) Appl. No.: 16/849,503

(22) Filed: Apr. 15, 2020

(51) Int. Cl.
*G01K 5/48* (2006.01)
*H03J 1/00* (2006.01)
*H01P 1/30* (2006.01)
*H03J 5/04* (2006.01)
*G01R 31/26* (2020.01)
*G05B 23/02* (2006.01)

(52) U.S. Cl.
CPC .............. *H03J 1/0008* (2013.01); *G01K 5/48* (2013.01); *G01R 31/2601* (2013.01); *G05B 23/0205* (2013.01); *H01P 1/30* (2013.01); *H03J 5/04* (2013.01)

(58) Field of Classification Search
CPC ... H03J 5/00; H03J 5/02; H03H 11/54; G01K 5/48; G01R 31/2601; G05B 23/0205
See application file for complete search history.

(56) References Cited

U.S. PATENT DOCUMENTS

| 7,135,941 | B1 * | 11/2006 | Tsironis | H01P 5/04 333/263 |
| 9,866,203 | B1 | 1/2018 | Tsironis | |
| 2006/0017530 | A1 * | 1/2006 | Boulerne | G01R 27/28 333/263 |
| 2008/0017355 | A1 * | 1/2008 | Attlesey | G06F 1/181 165/104.33 |
| 2010/0164421 | A1 * | 7/2010 | Dishman | F04D 27/004 318/471 |

OTHER PUBLICATIONS

Focus Microwaves, "Kilo-Watt Range Tuners" Product Note 90, Jul. 2017—https://focus-microwaves.com/product-notes-2/ (Year: 2017).*
Pierpointetai., The Design and Modelling of Automated Broadband Slide-Screw Tuners, Mar. 12, 2007, 29th ARFTG Conference Digest, Las Vegas, NV, pp. 218-228 (Year: 2007).*
Pierpoint Abstract, Mar. 12, 2007, 4 pp. (Year: 2007).*
Load Pull, [online] Wikipedia, [Retrieved on Nov. 18, 2016]. Retrieved from Internet <URL: https://en.wikipedia.org/wiki/Load_pull>.
"Computer Controlled Microwave Tuner, CCMT", Product Note 41, Focus Microwaves Inc. 1998, pp. 2-4.
Invar [online], Wikipedia [retrieved Jan. 11, 2019]. Retrieved from Internet <URL: http://en.wikipedia.org/wiki/Invar>.

(Continued)

*Primary Examiner* — Toan M Le (57) ABSTRACT

High power impedance tuners suffer from intense heating of the center conductor of the tuner airline (slabline), due to dissipated RF and DC power and, in addition to high electric field between the metallic tuning probe (slug) and the center conductor, also from associated thermal expansion causing sagging of the center conductor and possible electrical short. If the thermal expansion cannot be accommodated by structural means, the center conductor is cooled using forced air created by ventilators or re-circulating low loss dielectric liquid flowing through the slabline. Premature tuner aging through continuous airflow or cooling liquid circulation is avoided using real time monitoring of dissipated (heating) power and regulation of the cooling mechanism.

8 Claims, 9 Drawing Sheets

(56) References Cited

OTHER PUBLICATIONS

Thermocouple [online], Wikipedia [Retrieved on Mar. 18, 2020]. Retrieved from Internet <URL: https://en.wikipedia.org/wiki/Thermocouple>.
Scattering parameters [online], Wikipedia [Retrieved on Mar. 18, 2020], Retrieved from Internet <URL: https://en.wikipedia.org/wiki/Scattering_parameters>.

* cited by examiner

TEMPERATURE CONTROLLED HIGH POWER TUNER

PRIORITY CLAIM

Not applicable

CROSS-REFERENCE TO RELATED ARTICLES

1. Load Pull, [online] Wikipedia, [Retrieved on 2016 Nov. 18]. Retrieved from Internet <URL: https://en.wikipedia.org/wiki/Load_pull>
2. "Computer Controlled Microwave Tuner, CCMT", Product Note 41, Focus Microwaves Inc. 1998, pages 2-4.
3. Invar [online], Wikipedia [retrieved 2020 Apr. 14]. Retrieved from Internet <URL: http://en.wikipedia.org/wiki/Invar>
4. Thermocouple [online], Wikipedia [Retrieved on 2020 Mar. 18]. Retrieved from Internet <URL: https://en.wikipedia.org/wiki/Thermocouple>
5. Scattering parameters [online], Wikipedia [Retrieved on 2020 Mar. 18]. Retrieved from Internet <URL: https://en.wikipedia.org/wiki/Scattering_parameters>
6. Tsironis, C. U.S. Pat. No. 9,866,203, "High Reliability Power Tuners", FIG. 6.

BACKGROUND OF THE INVENTION

This invention relates to RF load and source pull testing of high-power RF transistors and amplifiers using remotely controlled electro-mechanical slide-screw impedance tuners (see ref. 2). Modern design of high-power RF amplifiers used in various communication systems, requires the active device's (microwave transistor's, Device Under Test, DUT) characteristics to be tested under realistic high-power conditions using high power slide screw impedance tuners.

A popular method for testing and characterizing such microwave transistors (DUT) in the non-linear region of operation is "load pull" (see ref. 1). Load pull is a measurement technique employing microwave slide screw impedance tuners (FIG. 1, see ref. 2) and other microwave test equipment, such as signal sources, test fixtures holding the DUT, DC bias networks and supply sources and RF power meters, the whole being controlled by a computer (FIG. 2); the computer controls and communicates with the tuners and the other instruments using digital cables. The tuners are used in order to manipulate the microwave impedance conditions under which the Device Under Test is tested (see ref. 1 and 2); tuners allow determining the optimum impedance conditions for designing amplifiers and other microwave components for specific performance targets. The computer monitors the dissipated power in the tuner by retrieving DC data ($I_{DC}$) flowing through the DUT and the tuner, and output RF power $P_{OUT}$ from the measurement instruments to be used, in real time, in the regulation algorithm.

Figure 1:
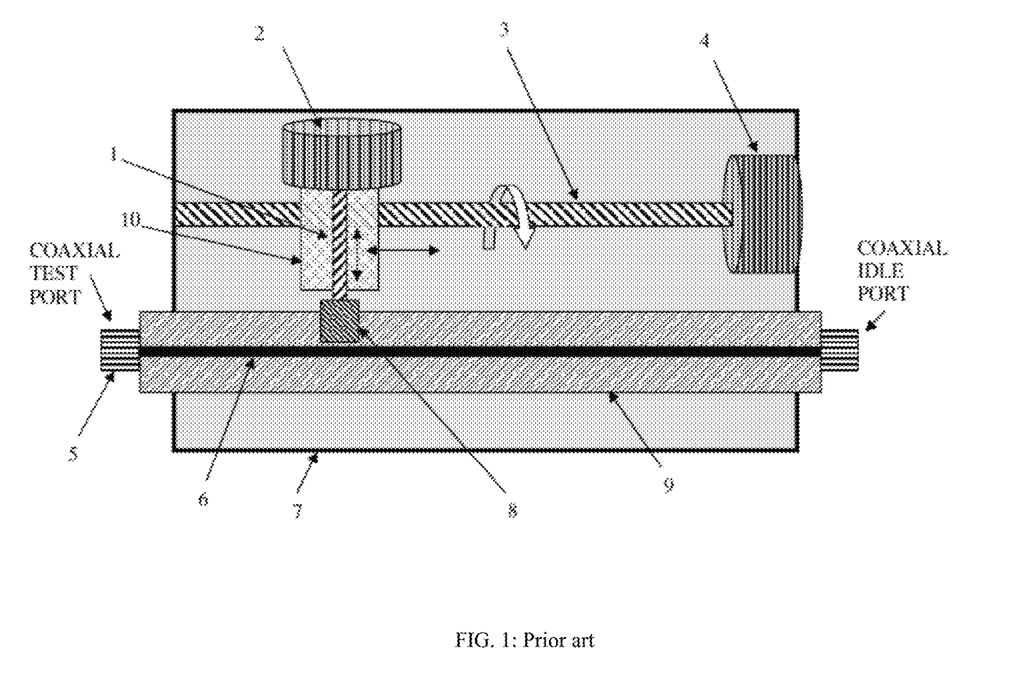
FIG. 1 depicts prior art, the structure and main components of a slide screw impedance tuner.
Figure 2:
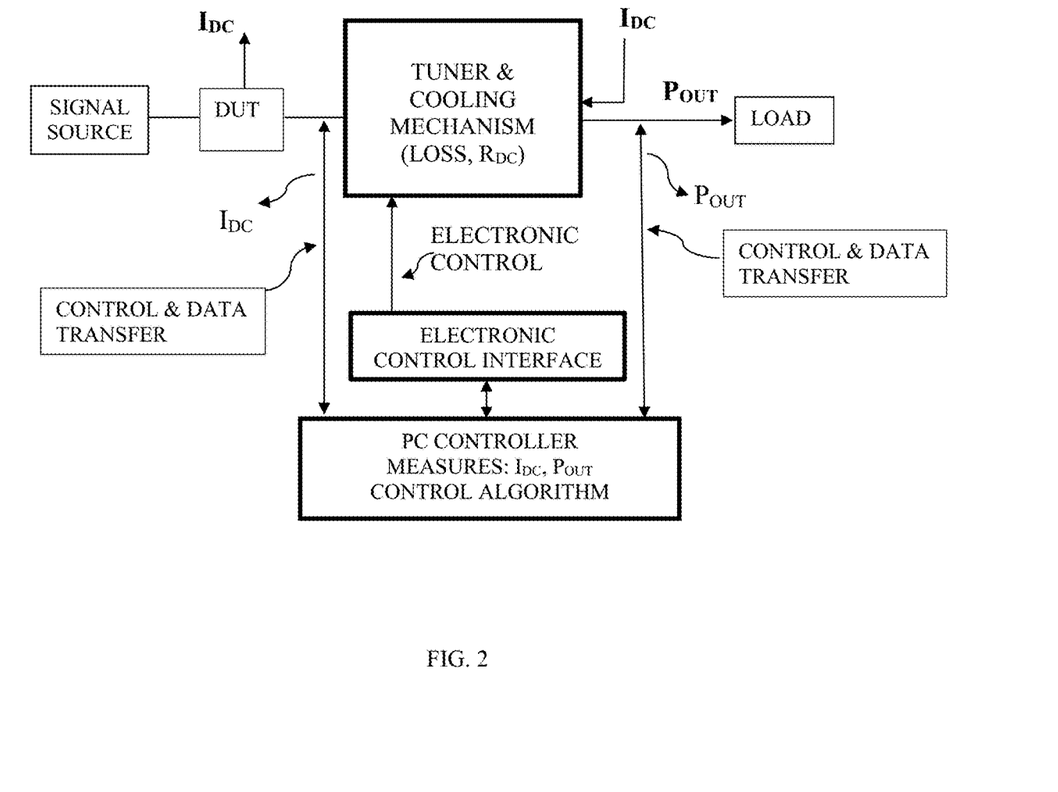
FIG. 2 depicts the concept and operation of a temperature regulated high power impedance tuner.

Commonly used impedance tuners are of the type "slide screw"; they comprise a transmission line (9) and adjustable tuning probes (8), FIG. 1, in a solid housing (7); the transmission line is typically a low loss parallel plate airline (slabline) with a test (5) and an idle port, both ports being equipped with coaxial connectors; the tuning probe (8) is attached to a remotely controlled precision vertical axis (1) which is mounted in a remotely controlled mobile carriage (10) sliding along the center conductor (6) which runs parallel to the axis of the slabline; the vertical axis (1) can move the probe (8) vertically towards the center conductor (6) using vertical motor (2) and the carriage (10) can move the probe (8) horizontally parallel to the center conductor (6) using Acme rod (3) and horizontal motor (4). The vertical movement controls the amplitude of the reflection factor seen at the tuner test port (5) whereas the horizontal movement controls its phase. This way the whole Smith chart is covered allowing a quasi-infinity of impedances from Zmin to Zmax to be synthesized at any given frequency within the "tuning range" (the maximum obtainable reflection factor GAMMA=(Z−Zo)/(Z+Zo)) of the tuner, wherein Zo=50 Ohm is the characteristic impedance of the slabline. Typical values of state-of the art tuners are |Zmin|≈2 Ohm and |Zmax|≈1250 Ohm.

Figure 3:
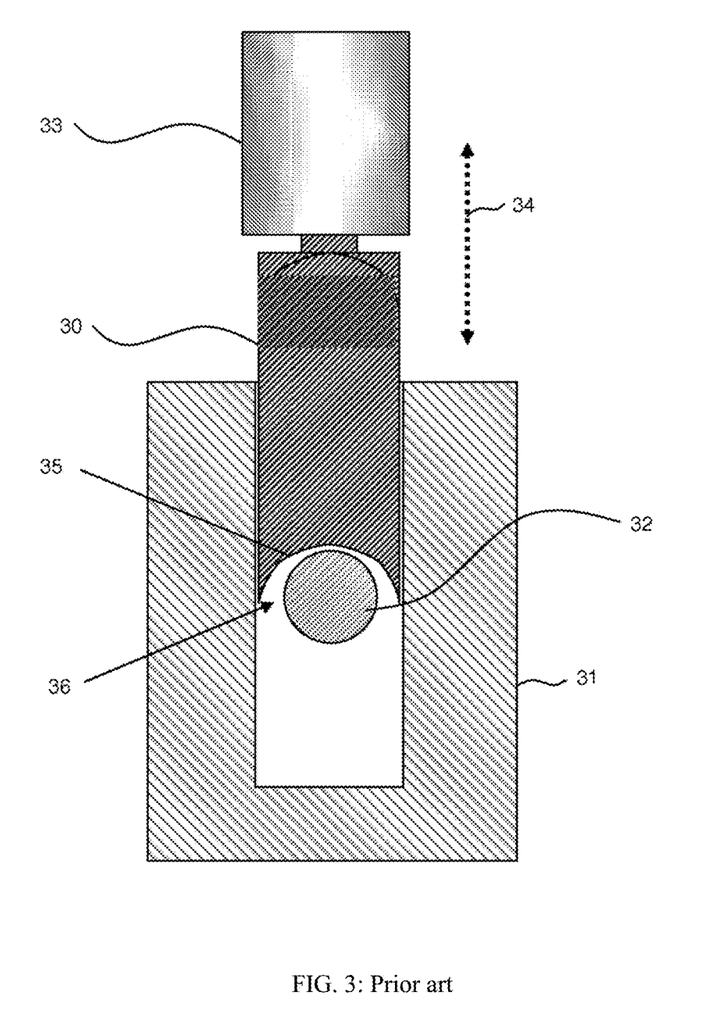
FIG. 3 depicts prior art, a cross section through the slabline and tuning probe of a slide screw tuner.
Figure 4:
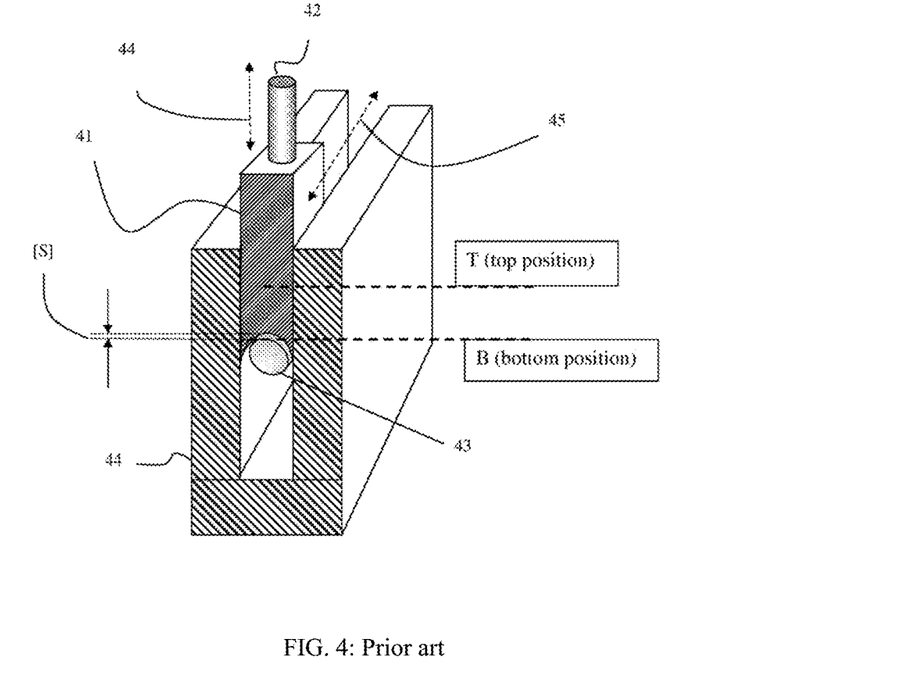
FIG. 4 depicts prior art, a perspective view of the tuning probe inside the channel of the slabline of a slide screw tuner.

Metallic tuning probes (30) are made in a cubical form (41) with a concave bottom (35) which allows to capture, when approaching vertically (34), controlled by axis (33), (42), the center conductor (32) (43) (see ref. 2 and FIGS. 3 and 4), the electric field which is concentrated in the area (36) between the center conductor (32) and the ground planes of the slabline (31). This "field capturing" allows creating high and controllable reflection factors. The critical part is the required proximity and accuracy of both the vertical (44) and horizontal (45) probe movement (FIG. 4), whereby changes in the vertical probe position of a few micrometers affects the VSWR by a large amount (see ref. 6).

Figure 6A:
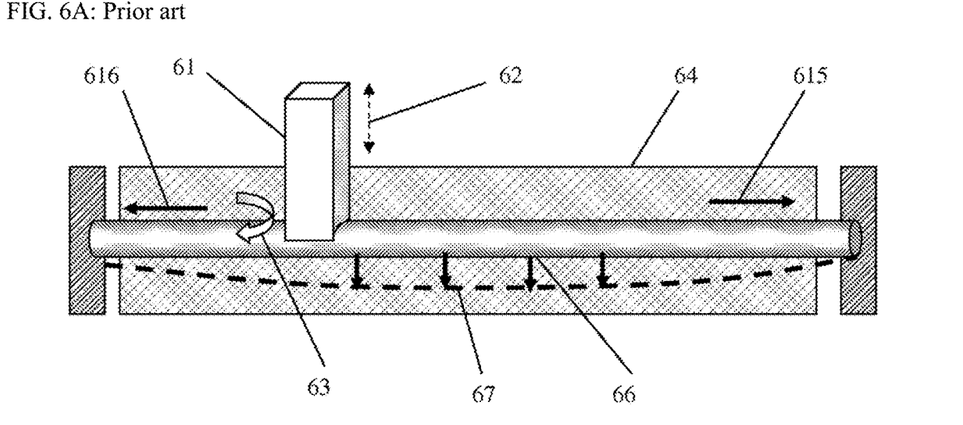
FIG. 6A depicts "buckling" or "sagging" of the center conductor.
Figure 6B:
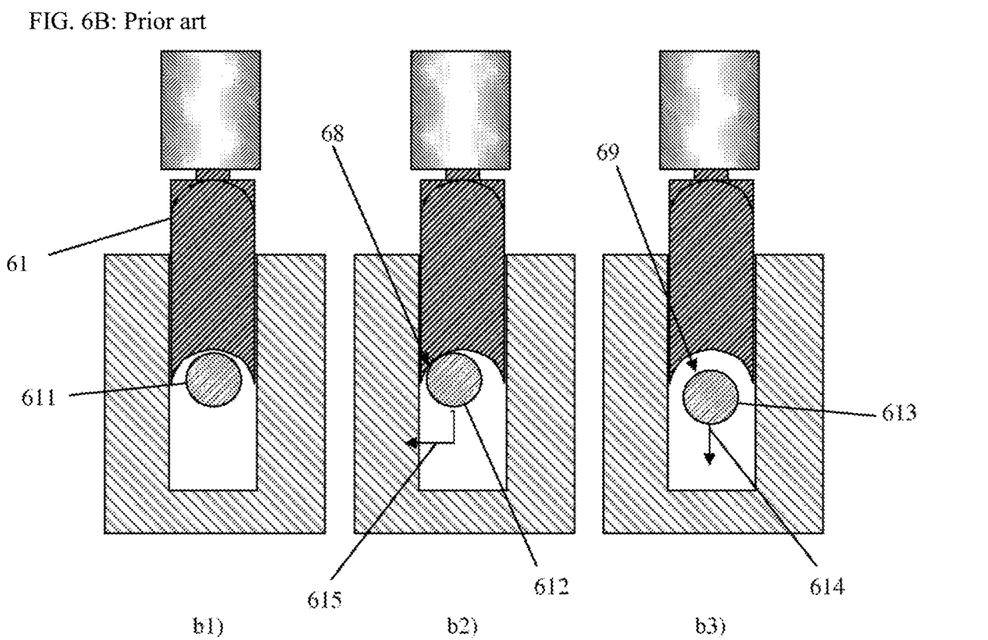
FIG. 6B depicts possible deflection situations of the center conductor.

When DC and microwave power is processed by the tuner, some of it is absorbed by the center conductor (43) of the slabline (40) and converted to heat. This leads to a rise of its temperature and associated, mostly linear, expansion (615, 616 in FIG. 6A) along the axis of the slabline by $\Delta L = \alpha * L * \Delta\Theta$, whereby L is the total length of the center conductor, α is the thermal expansion coefficient (TEC), typically 12 ppm/K for steel, and ΔΘ the raise in temperature above average. Since the center conductor (66), being anchored firmly on the coaxial connectors at the test and idle ports, has only limited range for axial expansion this will lead to "sagging or buckling" (67) in FIG. 6A); "Buckling" of the center conductor leads to deflection in different directions, depending on the pre-disposition and the anchoring on the coaxial end connectors; and it always affects the RF reflection factor (63), created by the tuning probe (61) approaching vertically (62) and operating in close proximity to the center conductor (66) of the slabline (64), see also FIG. 4. The center conductor (611, 612, 613), when heated, buckles and may either deflect sidewise (615), downwards (614) or upwards (not shown), in which case we will have a short circuit at position (68) in case (615) and when deflecting upwards, or loss of accuracy when the distance between the tuning probe and the center conductor increases (69) (case 614). From the form of the dotted line in FIG. 6A it also becomes obvious that the mechanism is far more complex, as the same tuner, under the same thermal stress will suffer catastrophic failure at different tuning conditions, because the deflection (and risk of electrical short) is higher when the tuning probe is close to the center of the tuner, in which case only the phase of the reflection factor changes. In either case the effect is at best loss of accuracy or at worst an electrical short and damage of the tuner and/or the DUT.

There are three possible situations when high RF and DC power is injected and processed (absorbed) in the slide screw tuner heating the center conductor, which has very low mass, has high thermal conductivity, is rapidly heated and thermally isolated from the environment:

a) the center conductor heats and expands, in which case the expansion must be accommodated for using appropriate design, without damage or loss of accuracy, b) the center conductor heats, but does not expand, which can be achieved by the center conductor being made using special expensive metallic alloy (INVAR, see ref. 3), or c) the center conductor is cooled enough to reduce its thermal expansion within allowable limits.

Figure 5:
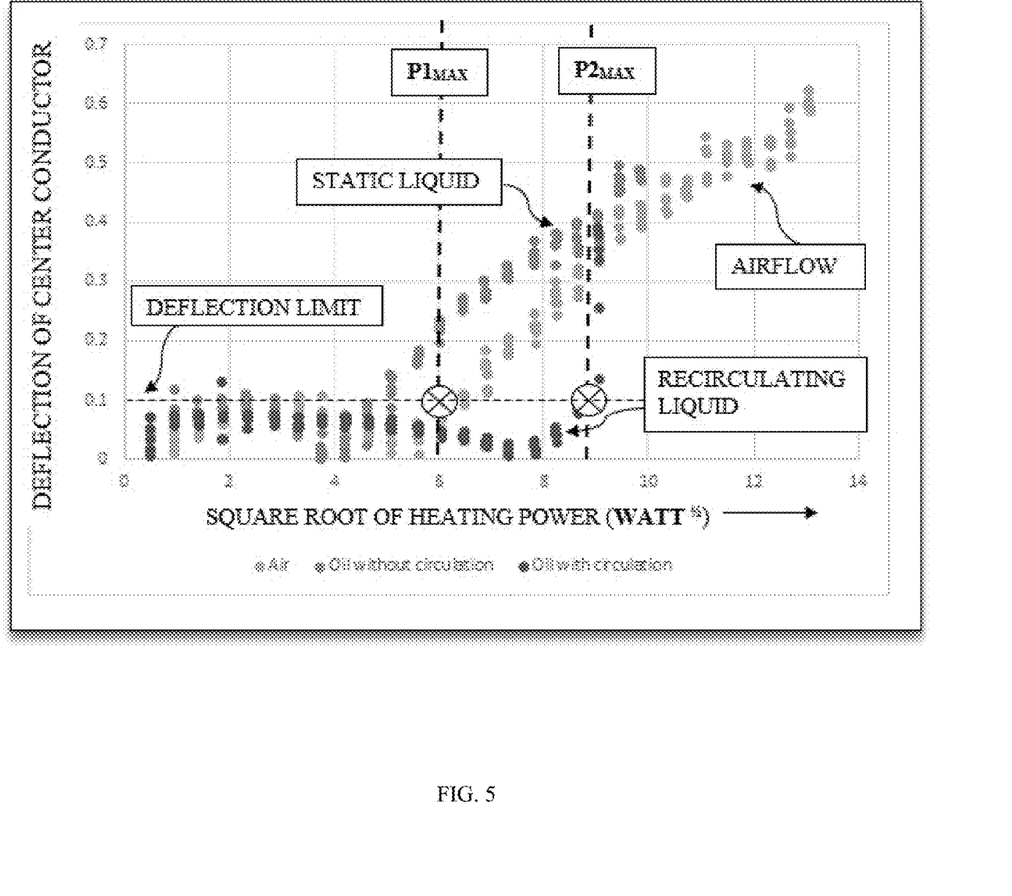
FIG. 5 depicts effect of various cooling methods on the deflection of the center conductor of slide screw tuner as a function of the square root of the dissipated energy inside the slabline.

Case c) can be achieved by either blowing cooling air over the center conductor or submerging the center conductor in cooling, recirculating, low loss, dielectric liquid by filling the slabline channel with this liquid. Experiments have shown that blowing cooling air over the center conductor or using static cooling liquid is not as efficient as using circulating cooling liquid up to a certain limit (FIG. 5). Considering practical implications, blowing cooling air is the first, simpler, choice and, if this reveals insufficient, it must be replaced by recirculating cooling liquid.

This invention discloses a method for controlling and regulating the heating and thermal expansion of the center conductor, without excessive waste of cooling energy, in order to avoid the risk of short circuit or loss of accuracy, in two basic embodiments: Embodiment 1 is using forced cooling air and embodiment 2 is using recirculating cooling liquid. Both embodiments use the same basic regulation concept allowing to avoid premature tuner aging caused by drying out the lubrication of the tuner gear or by evaporation/leakage of continuously recirculating cooling liquid.

BRIEF DESCRIPTION OF THE SEVERAL VIEWS OF THE DRAWINGS

The invention and its mode of operation will be more clearly understood from the following detailed description when read with the appended drawings in which:

FIG. 6A through 6B depict prior art, the effect of heating of the center conductor in slide screw tuner.

BRIEF DESCRIPTION OF THE INVENTION

Slide screw tuners are designed with three main objectives: (a) generating high GAMMA, (b) having low RF and DC loss and (c) handling high injected and dissipated RF and DC power. This is achieved by (i) using minimal thermal expansion material for the center conductor, (ii) employing high conductivity material for the sidewalls of the tuner airline (slabline) and (iii) Gold or Silver surface plating the center conductor. These measures promote low RF and DC loss, minimizing the amount of absorbed and dissipated injected RF and traversing DC power. However, when the tuners operate under exceptionally high power conditions of high power DUT (which require high DC current supply), thermal expansion of the center conductor leads to false measurements and possible damage of the tuner, whereas high RF loss leads also to high RF LOSS and high DC resistance ($R_{DC}$) which lead to heating the center conductor through power dissipation. It is therefore important to control and regulate the temperature of the center conductor by dielectric liquid cooling or forced airflow. For this an arsenal of control hardware and software components are required, including electric liquid pump and ventilator (fan) control, thermal calibration and monitoring and remote-control software and regulation algorithms.

DETAILED DESCRIPTION OF THE INVENTION

This invention discloses apparatus and method for controlling and regulating the temperature of core elements of slide screw tuners, such as the center conductor and the coaxial connectors operating under excessively high power conditions. The tuner is an RF two-port, best described by its scattering (s-) parameters (see ref. 5) for RF performance, and by the residual DC resistance $R_{DC}$ of the center conductor and coaxial connectors of its slabline for DC performance. In a typical load pull configuration (FIG. 2) the DUT is DC-biased through the tuner, i.e. bias networks are used to inject DC into the DUT bias current $I_{DC}$ and retrieve it through the output tuner (the input current in typical DUT is low and does not contribute noticeably to heating). The tuner absorbs also RF power. The dissipated power contributes to heating the center conductor, which is a suspended low mass item and cannot be cooled directly. The heating power NEAT is calculated as the sum of dissipated RF power $P_{RF}$ and DC power $P_{DC}$, wherein $P_{RF}=P_{OUT}*(1-1/LOSS)$, and the dissipated DC power is $P_{DC}=I_{DC}^2*R_{DC}$, wherein $P_{OUT}$ is the delivered RF power into the load, $I_{DC}$ is the DC current through the DUT and $R_{DC}$ is the residual DC resistance of the center conductor of the slabline, including the coaxial connector contact resistances at the test and idle ports of the tuner.

Figure 7:
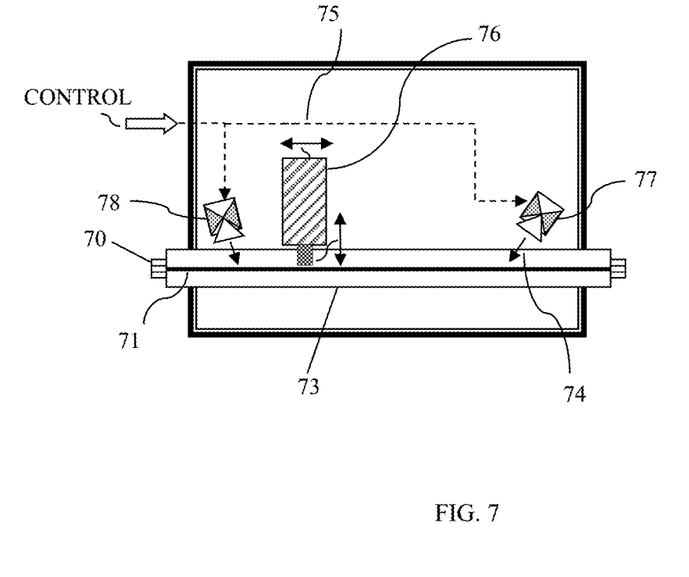
FIG. 7 depicts cooling the slabline using forced air.
Figure 8:
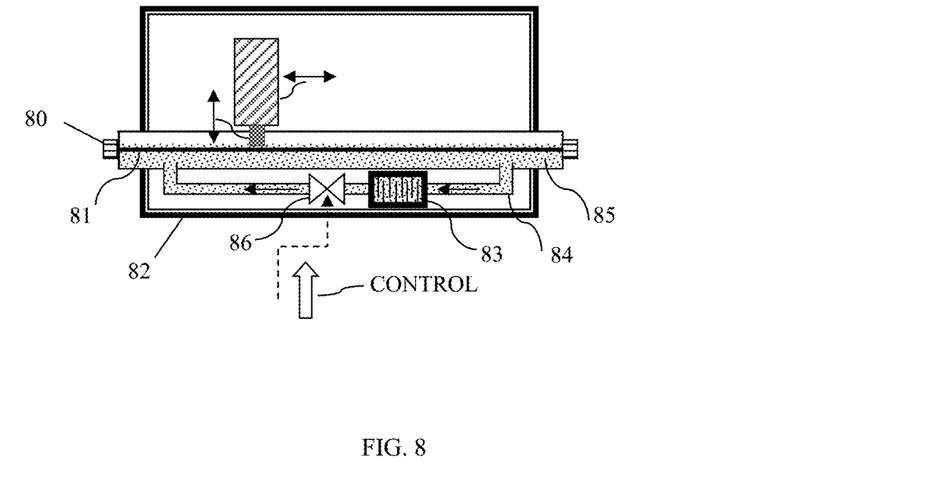
FIG. 8 depicts cooling the slabline using cooling dielectric liquid.

The two basic techniques addressed in this invention are outlined in FIGS. 7 and 8; FIG. 7 depicts the airflow method, whereby one or more ventilators (fans) (77), (78) direct (74) cooling air into the channel (slot) of the slabline (73) in order to remove the hot air created by the heated center conductor (71) especially in the section between test port (70) and carriage (76). However permanent airflow even if there is no heat is drying prematurely the lubricants needed for the tuner gear to run and shortens the tuner's life time. It is therefore imperative to regulate such airflow. To do so the operation of the ventilators must be regulated remotely, using appropriate control and electric cables (75). The control algorithm uses thermal calibration data and monitoring RF and DC power consumption by the tuner (FIG. 2) to decide.

FIG. 8 depicts the recirculating liquid cooling method. The slabline channel (85) is submerged in cooling dielectric liquid which is cooled in a radiator (83) and recirculates through pipes (84) driven by an electric, remotely controlled, liquid pump (86). The cooled liquid is injected into the hot area of the test port (80) to have a maximum effect on this section of the center conductor (81). The hot liquid is then sucked out from the area (85) close to the idle port. For practical and economy reasons the cooling mechanism is best integrated into the tuner housing (82). Again it is inefficient and abusive for the elements of the cooling mechanism (dielectric fluid, pumps and tubes) to operate the system non-stop, even if the center conductor is not heated. Therefore, here also the same methodology of thermal calibration, heat monitoring and regulation algorithm is used, as in the case of cooling through forced airflow.

Thermal calibration is a necessary step in the control and regulation procedure because real time temperature control is impractical or unfeasible It consists of the following steps, applied in either an air-filled slabline or in a cooling liquid filled slabline:

A) Connect the two ports of the slabline to a precise Ohm-meter and measure the DC resistance, $R_{DC}$.

B) Attach a thermal sensor (Thermocouple, see ref. 4) firmly to the center conductor close to the test port, which is where most of the heat is generated, to be removed after the calibration step, since it is incompatible with the tuner RF function.

C) Inject DC current $I_{DC}$ through the center conductor and measure the associated temperature Θ using the Thermocouple.

D) Calculate and save $\Theta(P_{HEAT})$ of the associated dissipated DC heating power $P_{HEAT}=R_{DC}*I_{DC}^2$.

E) Define, based on data retrieved from FIG. 5, a maximum allowable power $P_{MAX}$ to be absorbed by the tuner: $P1_{MAX}$ for recirculating cooling liquid, $P2_{MAX}$ for forced air or static cooling liquid. The deflection of the center conductor is expressed in relative logarithmic units and is measured in the RF domain, as a function of dissipated power, by observing the change in transmission factor S21 (in dB) of the slabline with the tuning probe placed in close proximity to the center conductor.

The relation $\Theta(P_{HEAT})$ forms the basis of the temperature regulation algorithm. The maximum allowed dissipation power is set to causing a change of 0.1 dB.

Figure 9:
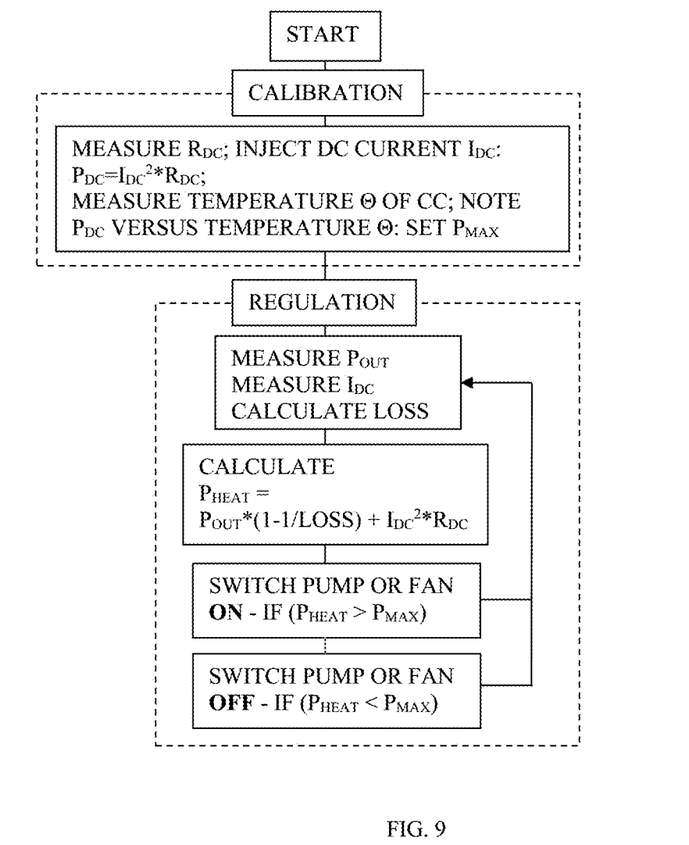
FIG. 9 depicts thermic calibration and temperature regulation flow chart.

After the thermal calibration, the Thermocouple is removed, the center conductor is re-instated and the tuner is calibrated in the RF domain by measuring the s-parameters (see ref. 5) for a multitude of tuning probe positions and saving in calibration files. The tuner is then ready to be used after the electronic control of the power supply to the ventilators or the liquid pump is activated by the control computer. During load pull measurements the control computer retrieves, in real time, data from the measurement instruments. The RF and DC instruments measure the output power $P_{OUT}$ and the DC current $I_{DC}$. Based on the s-parameters of the pre-calibrated tuner at RF frequencies, the power loss of the output tuner is calculated: LOSS=$(1-|S22|^2)/|S21|^2$. At this point it must be clarified that S21 and S22 are s-parameters of the tuner at a specific position of the tuning probe and change as the probe moves. LOSS can vary from 0.5 dB (LOSS=1.12) at low frequency and reflection factor and up to 5 dB (LOSS=3.16) or more at high frequency and reflection factor, depending on tuning state and frequency. This is why the proposed method is useful, because it takes into consideration all that in real time. Assuming a worst-case scenario, to be on the safe side, by which all lost power is transferred into heating the center conductor, and not into radiation, the power heating the center conductor is: $P_{HEAT}'=P_{OUT}*(1-1/LOSS)+R_{DC}*I_{DC}^2$. $P_{HEAT}'$ is to be compared with the calibrated value $P_{HEAT}$ (above) to extract the approximate temperature Θ of the center conductor and act when this reaches the limit $P_{MAX}$. If this temperature exceeds the allowable temperature, or if the associated heating power exceeds the allowable dissipated power, the ventilators or the liquid pump are switched ON. When the dissipated power sinks below the allowable value the ventilators or the pump are switched OFF. The method is in itself elaborated enough for allowing real time monitoring and control, because the LOSS of the tuner, the DC current and $P_{OUT}$ all change during load pull and the method allows instantaneous monitoring and action. Such monitoring is not easily replaceable by other non-contacting means, such as laser temperature detection (very difficult or impossible in liquid-submerged or mirror polished circular items, such as the gold-plated center conductor). The flow chart of the control and regulation algorithm is summarized in the flow-chart of FIG. 9.

Obvious alternative embodiments to the herein disclosed method of controlling and regulating the temperature and by that the thermal expansion of the center conductor of high power slide screw impedance tuners by controlling the supply of cooling air or flow of recirculating dielectric liquid, are imaginable and possible but shall not impede on the validity of the basic idea of the present invention.

What I claim is:

1. A temperature control and regulation mechanism in a high-power slide screw impedance tuner, comprising:
    the high-power slide screw impedance tuner which comprises a parallel plate transmission line (slabline) with two ports, a test port, and an idle port, linked with a center conductor and at least one mobile carriage sliding along the slabline; and
    the temperature control and regulation mechanism comprising:
    a) a calibration method in linking a temperature of the center conductor to a sum of a dissipated radio frequency (RF) and direct current (DC) power in the tuner,
    b) a regulated cooling mechanism linked to the temperature of the center conductor,
    c) an electronic control interface communicating with a control computer,
    d) a control computer communicating with RF and DC measurement instruments, and
    e) a real-time monitoring procedure of the dissipated RF and DC power and regulation of the temperature of the center conductor run in the control computer,
    wherein the control computer retrieves and evaluates RF s-parameters and DC data from the measurements instruments to calculate RF and DC dissipated power, retrieves a temperature Θ from a thermal calibration file and regulates the cooling mechanism through the electronic control interface.

2. The temperature control and regulation mechanism in a high-power slide screw impedance tuner as in claim 1, wherein the calibration method comprises a preparation step and a recording step,
    wherein the preparation step comprises:
    a) attaching a Thermocouple to the center conductor;
    b) measuring a DC resistance $R_{DC}$ of the center conductor between the test port and the idle port;
    and wherein the recording step comprises:
    c) injecting a DC current $I_DC$ through the center conductor and measuring a temperature Θ of the center conductor;
    d) calculating a DC power $P_{HEAT}=R_{DC}*I_{DC}^2$;
    e) saving the temperature Θ as a function of the DC power $P_{HEAT}$ in the thermal calibration file.

3. The temperature control and regulation mechanism in a high-power slide screw impedance tuner as in claim 1, wherein
    the at least one mobile carriage of the high-power slide screw impedance tuner is remotely controlled and slides along an axis parallel to the center conductor and includes a remotely controlled vertical axis mechanism holding a metallic tuning probe, insertable into the slabline and capacitively coupled with the center conductor.

4. The temperature control and regulation mechanism in a high-power slide screw impedance tuner as in claim 1, wherein the high-power slide screw impedance tuner includes at least one remotely controlled ventilator (fan) directing airflow into the slabline.

5. The temperature control and regulation mechanism in a high-power slide screw impedance tuner as in claim 4, wherein the control computer, which runs the monitoring- and center conductor temperature-regulation algorithm, controls the at least one ventilator through the electronic control interface.

6. The temperature control and regulation mechanism in a high-power slide screw impedance tuner as in claim 1, wherein the center conductor of the slabline is submerged in dielectric cooling liquid.

7. The temperature control and regulation mechanism in a high-power slide screw impedance tuner as in claim 6, wherein the regulated cooling mechanism comprises:

a container containing the cooling liquid, a remotely controlled electric liquid pump, and liquid supply pipes implanted into the slabline and linking a radiator with the electric liquid pump, allowing the cooling liquid to circulate through the slabline, and wherein the control computer, which runs the monitoring- and center conductor temperature-regulation algorithm, controls the electric liquid pump through the electronic control interface.

8. The temperature control and regulation mechanism in a high-power slide screw impedance tuner as in claim 6, wherein considering the presence of the dielectric cooling liquid, the slabline and center conductor are dimensioned, to create a characteristic impedance of 50 Ohm.

\* \* \* \* \*